(12) United States Patent
Meador et al.

(10) Patent No.: US 6,564,039 B1
(45) Date of Patent: May 13, 2003

(54) FREQUENCY GENERATION CIRCUIT AND METHOD OF OPERATING A TRANCEIVER

(75) Inventors: Richard B. Meador, Gilbert, AZ (US); Ronald H. Deck, Cooper City, FL (US); David J. Graham, Gilbert, AZ (US); David H. Minasi, Fort Lauderdale, FL (US); Brian Shelton, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/515,728

(22) Filed: Feb. 29, 2000

(51) Int. Cl.[7] .................................................. H04B 1/40
(52) U.S. Cl. ............................. 455/76; 455/78; 455/265; 375/376; 331/34
(58) Field of Search .......................... 455/73, 76, 78, 455/84, 85, 86, 88, 260, 264, 265; 375/376, 373, 295, 306, 327, 316; 331/34, 14

(56) References Cited

U.S. PATENT DOCUMENTS

| | | | |
|---|---|---|---|
| 4,521,891 A | * 6/1985 | Biba et al. .................... 375/222 |
| 5,055,800 A | 10/1991 | Black et al. ................... 331/1 A |
| 5,055,802 A | 10/1991 | Hietala et al. ................. 331/16 |
| 5,070,310 A | 12/1991 | Hietala et al. ................. 331/1 A |
| 5,093,632 A | 3/1992 | Hietala et al. ................. 331/1 A |
| 5,111,162 A | 5/1992 | Hietala et al. ................. 332/127 |
| 5,150,078 A | * 9/1992 | Yang et al. ..................... 331/2 |
| 5,163,160 A | * 11/1992 | Foucher et al. ................ 455/76 |
| 5,166,642 A | 11/1992 | Hietala ......................... 331/1 A |
| 5,179,726 A | * 1/1993 | Moon ........................... 455/180.4 |
| 5,317,284 A | * 5/1994 | Yang .............................. 331/2 |
| 5,493,700 A | 2/1996 | Hietala et al. ................. 455/75 |
| 5,495,206 A | 2/1996 | Hietala ......................... 331/1 A |
| 5,890,051 A | 3/1999 | Schlang et al. ................ 455/76 |
| 6,002,924 A | * 12/1999 | Takano .......................... 455/161.1 |
| 6,118,984 A | * 9/2000 | Yu-Hong ....................... 455/76 |
| 6,150,886 A | * 11/2000 | Shimomura .................... 331/2 |
| 6,211,747 B1 | * 4/2001 | Trichet et al. ................. 332/128 |
| 6,259,293 B1 | * 7/2001 | Hayase et al. ................. 327/276 |
| 6,308,048 B1 | * 10/2001 | Gore et al. .................... 455/76 |
| 6,345,173 B1 | * 2/2002 | Fourtet et al. ................. 455/76 |
| 6,393,081 B1 | * 5/2002 | Whetsel ........................ 375/354 |

OTHER PUBLICATIONS

US patent application No.: 09/297,847, Fourtet et al., Filed: May 6, 1999, Motorola, Inc.
US patnet application No.: 09/322,533, Trichet et al., Filed: May 28, 1999, Motorola, Inc.

* cited by examiner

Primary Examiner—Lee Nguyen
Assistant Examiner—Congvan Tran
(74) Attorney, Agent, or Firm—Barbara R. Doutre

(57) ABSTRACT

A frequency generation circuit includes an oscillator (403), a comparator (413) coupled to the oscillator, a first divider (407) coupled to the comparator, a PLL (400) coupled to the first divider, a second divider (422) coupled to the PLL, a first multiplexor (409) coupled to the second divider, a third divider (408) coupled to the comparator and the first multiplexor, a second multiplexor (410) coupled to the comparator and the reference clock PLL, a fourth divider (411) coupled to the second multiplexor, a fifth divider (412) coupled to the comparator, and a seventh divider (450) coupled to the comparator. A method of operating a transceiver includes using the frequency generation circuit to provide a first clock signal, a second clock signal, a first reference frequency, and a second reference frequency for a first component, a second component, a third component, and a fourth component, respectively, of the transceiver.

21 Claims, 3 Drawing Sheets

FREQUENCY GENERATION CIRCUIT AND METHOD OF OPERATING A TRANCEIVER

FIELD OF THE INVENTION

This invention relates to wireless communications, in general, and to frequency generation circuitry and methods of operating a transceiver having frequency generation circuitry, in particular.

BACKGROUND OF THE INVENTION

Cellular telephones operate under a wide variety of wireless protocols. Examples of such wireless protocols include a digital cellular service (DCS) wireless protocol, a Global System for Mobile Phones (GSM) wireless protocol, and an enhanced GSM (EGSM) wireless protocol. Other examples of such wireless protocols include a time division multiple access (IS-136 TDMA) wireless protocol and its precursor North American digital cellular (NADC) wireless protocol. Still further examples of such wireless protocols include an integrated digitally enhanced network (IDEN) wireless protocol, and an advanced mobile phone service (AMPS) wireless protocol.

In the past, cellular telephones operated under a single wireless protocol, but new cellular telephones are capable of operating under two or more wireless protocols. An example is a cellular telephone that operates primarily on a GSM system using the GSM wireless protocol, but can roam outside the GSM system and register on a TDMA system using the IS-136 TDMA wireless protocol. However, these new cellular telephones use extremely inefficient and costly circuitry to down-convert a received radio frequency (RF) signal on multiple frequency bands, to up-convert a signal for wireless transmission on multiple frequency bands, to generate internal clock signals for the microcontroller, and to generate timing signals for the data interfaces to the digital signal processing circuitry.

The circuitry used in single protocol cellular telephones is often reused in multiple protocol cellular telephones in a parallel manner. However, this mere aggregation of old circuitry produces a high parts count and complex programming in the new cellular telephones. An example is a cellular telephone operating under the GSM wireless protocol that has an AMPS accessory module that interfaces to the back housing of the cellular telephone to permit the cellular telephone to also operated under the AMPS wireless protocol. This implementation of a dual protocol GSM/AMPS phone is inefficient in terms of redundant and costly circuitry.

Accordingly, a need exists for a frequency generation circuit and method of operating a transceiver comprising the frequency generation circuit that efficiently and cost-effectively down-converts a received RF signal on multiple frequency bands, up-converts a signal for wireless transmission on multiple frequency bands, generates internal clock signals for the microcontroller, and generates timing signals for the data interfaces to the digital signal processing circuitry. Furthermore, a need exists for the frequency generation circuit and method of operating a transceiver comprising the frequency generation circuit to be capable of operating under at least a majority of the wireless protocols.

BRIEF DESCRIPTION OF THE DRAWINGS

The invention will be better understood from a reading of the following detailed description, taken in conjunction with the accompanying drawing figures in which.

Figure 1:
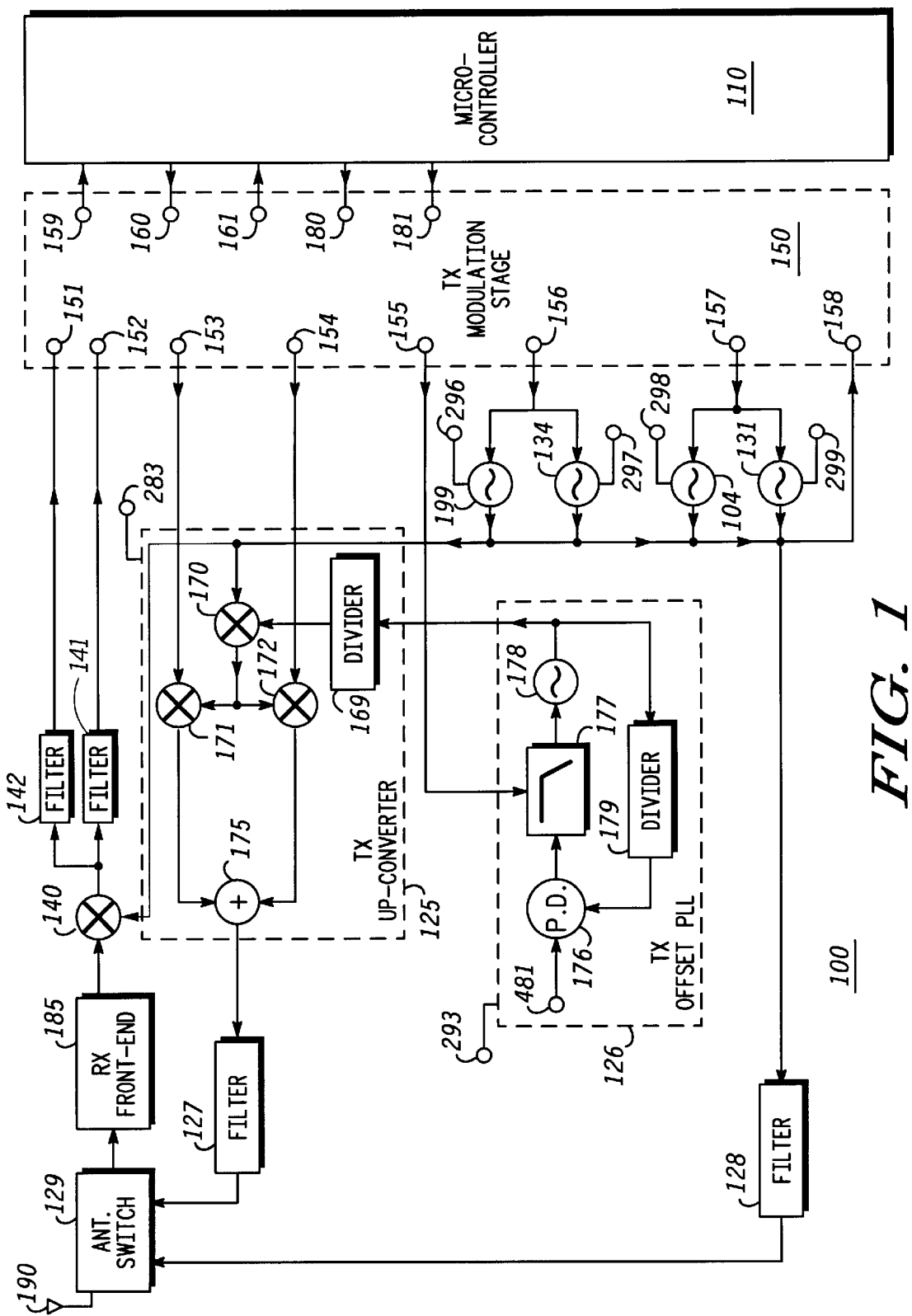
FIG. 1 illustrates a block diagram of a transceiver in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, the same reference numerals in different drawing figures denote the same elements.

DETAILED DESCRIPTION OF THE DRAWINGS

FIG. 1 illustrates a block diagram of a transmitter and receiver (transceiver) 100. Transceiver 100 represents a single wireless transceiver capable of operating according to all of the following wireless protocols: DCS, GSM, EGSM, TDMA, NADC, IDEN, and AMPS. In the preferred embodiment, transceiver 100 is a portion of a mobile cellular telephone.

Transceiver 100 comprises a transceiver architecture that efficiently provides the frequency generation for the transmit and receive frequency bands of the following wireless protocols: EGSM Transmit (880 to 915 MegaHertz (MHz)), EGSM Receive (925 to 960 MHz), GSM Transmit (890 to 915 MHz), GSM Receive (935 to 960 MHz), IDEN Transmit (806 to 825 MHz), IDEN Receive (851 to 870 MHz), TDMA and AMPS Transmit (824 to 849 MHz), TDMA and AMPS Receive (869 to 894 MHz), DCS Transmit (1710 to 1785 MHz), and DCS Receive (1805 to 1880 MHz). In addition, transceiver 100 comprises coordinated clock generation circuitry for baseband data recovery and baseband data transmission for EGSM, GSM, IDEN, NADC, AMPS, and DCS wireless protocols. Circuit elements such as reference oscillators and frequency dividers used to provide frequency generation for transmit and receive circuits are also used for data transmission and clock recovery. As used herein, the term "TDMA" includes the NADC and IS-136 TDMA, and the term "EGSM" includes GSM. Accordingly, NADC and IS-136 are subsets of TDMA, and GSM is a subset of EGSM.

Transceiver 100 comprises an antenna 190 coupled to a switched antenna filter network 129, a receiver (RX) front-end stage 185 coupled to switched antenna filter network 129, a RX down mixer 140 coupled to RX front-end stage 185, and frequency selection filters 141 and 142 coupled to down mixer 140. Switched antenna filter network 129 comprises a duplexer when the AMPS wireless protocol is used. The duplexer permits transceiver 100 to simultaneously transmit and receive RF signals.

Transceiver 100 also comprises a transmit (TX) up-converter stage 125. TX up-converter stage 125 comprises a first mixer 171, a second mixer 172, an image reject mixer 170 coupled to mixers 171 and 172, a frequency divider 169 coupled to image reject mixer 170, and an adder 175 coupled to mixers 171 and 172. One skilled in the art will understand that TX up-converter stage 125 may include other components known in the art.

Transceiver further comprises a TX offset phase lock loop (PLL) 126 coupled to TX up-converter stage 125. TX offset PLL 126 comprises a phase detector 176 receiving a reference frequency via a node 481, a low pass filter 177 coupled to phase detector 176, a voltage-controlled oscillator (VCO)

178 coupled to low pass filter 177 and to frequency divider 169 in TX up-converter stage 125, and a frequency divider 179 coupled to VCO 178 and phase detector 176. One skilled in the art will understand that TX offset PLL 126 may include other components known in the art.

Transceiver 100 additionally comprises a first filtered amplifier stage 127 coupled to adder 175 of TX up-converter stage 125 and to switched antenna filter network 129, and transceiver 100 further comprises a second filtered amplifier stage 128 coupled to switched antenna filter network 129. Transceiver 100 further comprises a DCS TX mode voltage-controlled oscillator (VCO) 131 coupled to filtered amplifier stage 128, an EGSM TX mode VCO 104 coupled to filtered amplifier stage 128, an IDEN/TDMA/AMPS TX/RX mode VCO 134 coupled to filtered amplifier stage 128, to TX up-converter stage 125, and to mixer 140, and an EGSM/DCS RX mode VCO 199 coupled to mixer 140. VCOs 131, 104, 134, and 199, TX up-converter stage 125, filtered amplifier stage 128, and portion 150 are selected and enabled via control lines from control register 216 (FIG. 2) as required for each mode of operation.

VCOs 131, 104, 134, and 199 operate over the following frequency ranges: DCS TX mode VCO 131 is enabled in the DCS TX mode and operates from approximately 1,710 to 1,785 MHz; EGSM TX mode VCO 104 is enabled in the EGSM transmit mode and operates from approximately 880 to 915 MHz; IDEN/TDMA/AMPS TX/RX mode VCO 134 is enabled in the IDEN, TDMA, and AMPS receive and transmit modes and operates from approximately 963 to 1,006 MHz; EGSM/DCS RX mode VCO 199 is enabled in the EGSM and DCS receive modes and operates from approximately 1,325 to 1,480 MHz. VCOs 104, 134, and 199 operate in more than one mode. VCO 104 operates over approximately 880 to 915 MHz in the EGSM transmit mode, and VCO 104 also operates over approximately 890 to 915 MHz in the GSM transmit mode. VCO 134 operates over approximately 963 to 982 MHz in the IDEN transmit and receive modes, and VCO 134 also operates from approximately 981 to 1,006 MHz in the TDMA and AMPS receive and transmit modes. VCO 199 operates from approximately 1,325 to 1,360 MHz in the EGSM receive mode and VCO 199 also operates from approximately 1,405 to 1,480 MHz in the DCS receive mode.

Transceiver 100 further comprises a microcontroller 110, which preferably comprises a microprocessor (uP) and a digital signal processor (DSP). Transceiver 100 further comprises a portion 150 coupled to microcontroller 110 via nodes 159, 160, 161, 180, and 181, to VCOs 104 and 131 via a node 157, to VCOs 134 and 199 via a node 156, to mixers 171 and 172 in TX up-converter stage 125 via nodes 153 and 154, to low pass filter 177 in TX offset PLL 126 via a node 155, and to frequency selection filters 142 and 141 via nodes 151 and 152.

Figure 2:
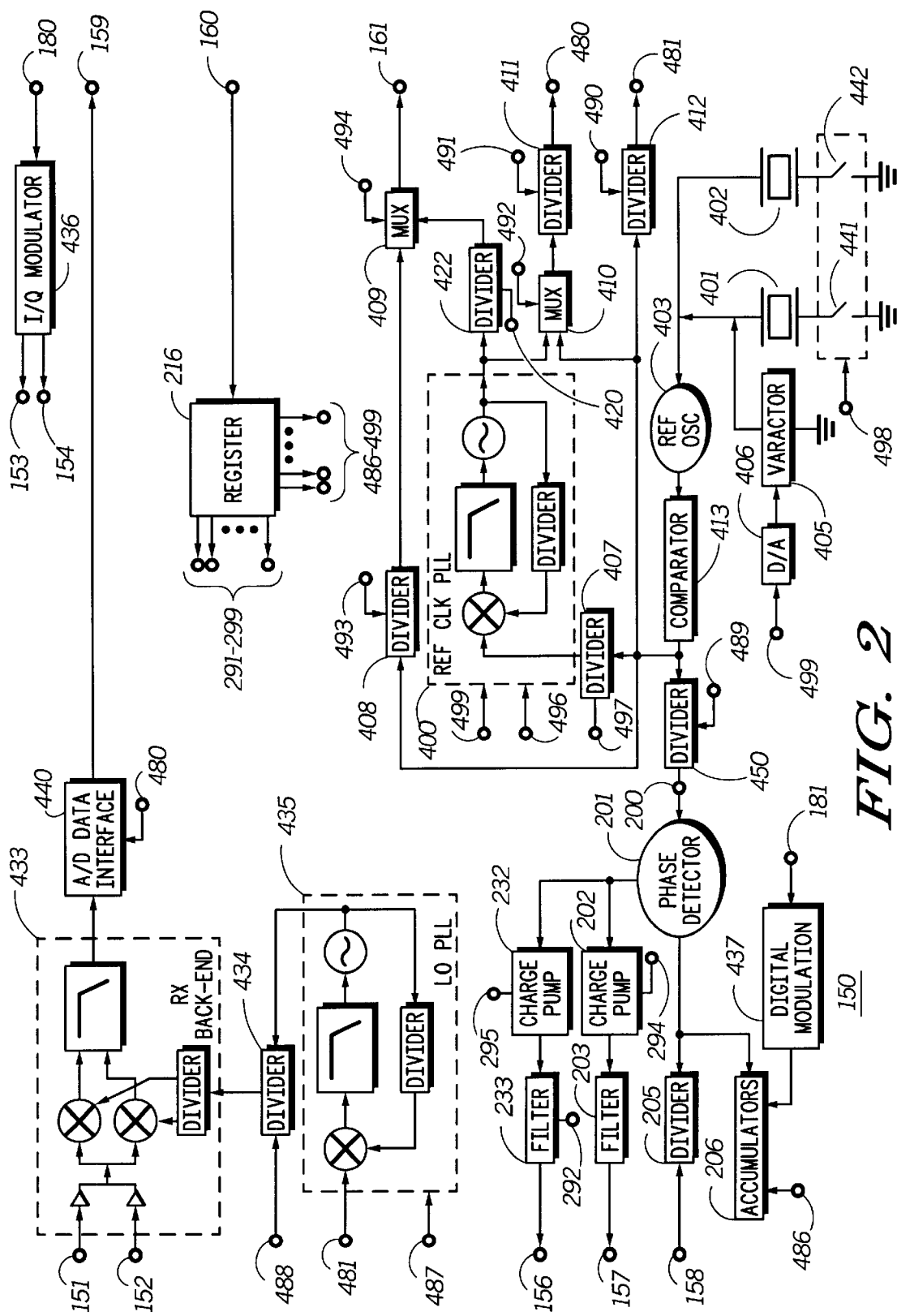
FIG. 2 illustrates a more detailed block diagram of a portion of the transceiver of FIG. 1 in accordance with an embodiment of the invention.

FIG. 2 illustrates a more detailed block diagram of portion 150 of transceiver 100. In the preferred embodiment, all elements of portion 150 illustrated in FIG. 2 with the exceptions of crystal elements 401 and 402 and switches 441 and 442 are fabricated in a single bipolar complimentary metal oxide semiconductor (BiCMOS) integrated circuit (IC) that is packaged in a ball grid array (BGA) surface mount package. FIG. 2 is described in conjunction with FIG. 1. All elements having a reference numeral between 200 and 499 are illustrated in FIG. 2, and all elements having a reference numeral between 100 and 199 are illustrated in FIG. 1. Some of the elements having reference numerals between 100 and 199 are repeated in FIG. 2 for continuity, and some of the elements having reference numerals between 200 and 499 are repeated in FIG. 1 for continuity.

In general, portion 150 comprises a fractional N phase lock loop (PLL) synthesizer, a second local oscillator (LO) PLL 435, a reference clock PLL 400, a reference oscillator 403, a RX back-end stage 433, a receiver analog to digital (A/D) converter and data interface stage 440, a baseband digital modulation stage 437, a baseband I/Q modulation stage 436, and a serial control register 216. LO PLL 435 is illustrated to include a phase detector, a low pass filter, a VCO, and a divider, but one skilled in the art will understand that LO PLL 435 may include other features known in the art. Reference clock PLL 400 is illustrated to include a mixer, a low pass filter, a VCO, and a divider, but one skilled in the art will understand that PLL 400 may include other features known in the art. RX back-end stage 433 is illustrated to include buffers, mixers, a low pass I/Q filter stage, and a divider that divides by two, but one skilled in the art will understand that RX back-end stage 433 may include other features known in the art. Digital modulation stage 437 comprises a digital filter interface, is coupled to microcontroller 110 (FIG. 1) via node 181, and is also coupled to accumulators 206. Digital modulation stage 437 provides digital Gaussian minimum shift keying (GMSK) modulation in the EGSM and DCS transmit modes. Baseband I/Q modulation stage 436 comprises an I channel and a Q channel, is coupled to microcontroller 110 (FIG. 1) via node 180, and is also coupled to TX up-converter stage 125 (FIG. 1) via nodes 153 and 154. Baseband I/Q modulation stage 436 provides phase (I) and quadrature (Q) modulation for the IDEN, TDMA, AMPS transmit modes. The I/Q modulation stage 436 receives modulation data from microcontroller 110 via node 180, and I/Q modulation stage 436 transmits analog I and Q output signals to TX up-converter stage 125 (FIG. 1) via nodes 153 and 154.

The fractional N synthesizer is a PLL comprising a main phase detector 201 receiving a reference frequency from a node 200, a wide band charge pump 202 coupled to phase detector 201, a wide band loop filter 203 coupled to wide band charge pump 202, VCO 131 (FIG. 1) coupled to wide band loop filter 203 via node 157, a frequency divider 205 coupled to VCO 131 via a node 158 and also coupled to phase detector 201, and a multi-accumulator or accumulators 206 coupled to frequency divider 205. The fractional N synthesizer also comprises a VCO 104 (FIG. 1) coupled to wide band loop filter 203 via node 157 and also coupled to frequency divider 205 via node 158. Accordingly, VCO 104 is in parallel with VCO 131. The fractional N synthesizer further comprises a charge pump 232 coupled to phase detector 201, a loop filter 233 coupled to charge pump 232, and a VCO 134 (FIG. 1) coupled to loop filter 233 via node 156 and also coupled to frequency divider 205 via node 158. Loop filter 233 operates as either a narrow band or a wide band loop filter according to a control signal sent by register 216 via a node 292. When operating with a narrow bandwidth, loop filter 233 has a bandwidth that is smaller than a bandwidth of wide band loop filter 203. When used with VCO 134, loop filter 233 operates as a narrow bandwidth loop filter, and when used with VCO 199, loop filter 233 operates as a wide bandwidth loop filter. Charge pump 232, loop filter 233, and VCO 134 are in parallel with wide band charge pump 202, wide band loop filter 203, and VCO 131 and are also in parallel with wide band charge pump 202, wide band loop filter 203, and VCO 104. One skilled in the art will understand that the fractional N synthesizer may include other components known in the art.

The fractional N synthesizer's four VCOs 104, 131, 134, and 199, two charge pumps 202 and 232, and two loop filters 203 and 233 are reconfigured for the different wireless protocol to provide the required frequency range and the optimum PLL bandwidth. The particular configuration for each protocol will be described later. In all transmit and receive modes for all protocols, frequency divider 205 is a programmable divider with divider ratio controlled by accumulators 206. The divided down signal of frequency divider 205 is coupled to accumulators 206. This technique of fractional N division by time averaging the divider ratio of frequency divider 205 is known to those skilled in the art.

Portion 150 of transceiver 100 (FIG. 1) further comprises a crystal reference oscillator 403, a crystal element 401 coupled to reference oscillator 403, a crystal element 402 coupled to reference oscillator 403, crystal select switches 441 and 442, a varactor stage 405 coupled to reference oscillator 403, and a digital to analog (D/A) converter 406 coupled to varactor stage 405. Portion 150 additionally comprises a comparator 413 coupled to reference oscillator 403. Comparator 413 converts an analog signal received from reference oscillator 403 to a digital signal. Reference oscillator 403 operates at either a first frequency set by crystal element 401 or a second frequency set by crystal element 402. In particular, reference oscillator 403 may operate in a first mode preferably at a frequency of approximately 16.8 MHz set by crystal element 401. Additionally, reference oscillator 403 may operate in a second mode preferably at a frequency of approximately 26 MHz set by crystal element 402. Crystal select switches 441 and 442 are programmed on or off by a control signal sent by register 216 to switches 441 and 442 via a node 498. Fine adjustment of the operating frequency of reference oscillator 403 is controlled by D/A converter 406 coupled to varactor stage 405. The variable output capacitance of varactor stage 405 is set by the programmed output voltage of D/A converter 406. D/A converter 406 is controlled by a programming signal sent from register 216 to D/A converter 406 via a node 499. The use of a D/A converter to control the capacitance of a varactor stage to fine tune the operating frequency of a reference oscillator is known in the art. As explained hereinafter, fine adjustment of reference oscillator 403 is used in one or more wireless protocol modes of transceiver 100 to implement automatic frequency control (AFC).

Portion 150 of transceiver 100 (FIG. 1) also comprises a programmable PLL reference divider 407 coupled to crystal reference oscillator 403 via comparator 413, a reference clock PLL 400 coupled to divider 407, a first reference clock divider 422 coupled to reference clock PLL 400, a multiplexor (mux) 409 coupled to divider 422, and a second reference clock divider 408 coupled to mux 409 and to reference oscillator 403 via comparator 413. Register 216 sends a control signal to divider 408 via a node 493 to divide the frequency received from crystal reference oscillator 403 by either one or two, and register 216 sends a control signal to divider 407 via a node 497 to divide the frequency received from crystal reference oscillator 403. Register 216 also sends a control signal to reference clock PLL 400 via a node 495 to program the divider ratio in PLL 400. In the preferred embodiment, the operating frequency of PLL 400 may be adjusted in fine increments by a control signal from register 216 via a node 496. Fine adjustment of PLL 400 is used in the GSM and DCS transmit and receive modes of transceiver 100 to implement automatic frequency control (AFC).

Mux 409 allows different clock signals to be coupled to a component in transceiver 100. In the preferred embodiment, the different clock signals are coupled from mux 409 to microcontroller 110 via node 161. Mux 409 selects a clock signal from reference clock PLL 400 or the frequency divided signal from reference oscillator 403. The clock signal from reference clock PLL 400 may be corrected by automatic frequency control (AFC) and thereby provides a more accurate or precise clock signal than the clock signal from crystal reference oscillator 403, but reference clock PLL 400 has high current drain of approximately 2 milli-Amperes (mA) when enabled. This current drain substantially reduces battery life. Therefore, reference clock PLL 400 is preferably enabled only for the wireless protocols that require a highly accurate time base for microcontroller 110. Microcontroller 110 sends an instruction signal to register 216 via a node 160, and register 216 sends a control signal to mux 409 via a node 494 to determine whether to transmit the more precise clock signal or the less precise clock signal to microcontroller 110.

These different clock signals are used for different wireless protocols such as the DCS, EGSM, TDMA, IDEN, and AMPS wireless protocols. Reference clock PLL 400 is preferably not used for the IDEN wireless protocol to conserve power, but reference clock PLL 400 is preferably used for the DCS and EGSM wireless protocols which require a more accurate time base for microcontroller 110. In the preferred embodiment, the clock signals provided by mux 409 are at approximately 13 MHz for the DCS and EGSM wireless protocols, 16.8 MHz for the IDEN wireless protocol, 19.44 MHz for the TDMA and AMPS wireless protocols. The 13 MHz clock is preferred for the DCS and EGSM protocols because the bit clock rate is standardized at 270.833 KHz, which is 13 MHz divided by 48. For the TDMA wireless protocol, the symbol rate is standardized at 24.3 K symbols per second, which is 19.44 MHz divided by 800. Industry standards further require TDMA cellular telephones to be capable of switching between TDMA and AMPS wireless protocols. Therefore, the microcontroller clock signal for the AMPS wireless protocol is preferably the same frequency as used for the TDMA wireless protocol.

When transceiver 100 operates according to the DCS and EGSM wireless protocols, register 216 sends a control signal to switch 442 via node 498 to close switch 442 so that crystal element 402 is used. PLL 400 is programmed by register 216 via node 495 to output a signal at approximately 39 MHz. Divider 422 is programmed by register 216 via a node 420 to frequency divides the signal from PLL 400 by 3 and to output a signal of approximately 13 MHz. Similarly, when transceiver 100 operates according to the TDMA and AMPS wireless protocols, register 216 sends a control signal to switch 441 via node 498 to close switch 441 so that crystal element 401 is used. Reference clock PLL 400 is programmed by register 216 via node 495 to output a signal at approximately 38.88 MHz. Divider 422 is programmed by register 216 via a node 420 to frequency divide the signal from PLL 400 by 2 and to output a signal of approximately 19.44 MHz. Moreover, when transceiver 100 operates according to the IDEN wireless protocol, register 216 sends a control signal to switch 441 via node 498 to close switch 441 so that crystal element 401 is used, and register 216 also sends a control signal to divider 408 via a node 493 to program divider 408 to divide by one and to output a signal of approximately 16.8 MHz. Mux 409 is programmed to select these clock signals as the clock signal for microcontroller 110.

Portion 150 of transceiver 100 (FIG. 1) also includes different AFC techniques to correct for crystal imperfections in crystal elements 401 and/or 402. A first AFC technique corrects the clock signal at crystal reference oscillator 403. This first embodiment uses D/A converter 406 and varactor stage 405. Microcontroller 110 transmits a signal to register 216 via node 160, and register 216 sends a control signal to D/A converter 406 via a node 499 to control D/A converter 406. D/A converter 406 controls the voltage applied to varactor stage 405, and varactor stage 405 adjusts the clock signal of crystal reference oscillator 403. This first AFC technique is preferably used for the IDEN wireless protocol because of the low current drain associated with this technique. However, this first AFC technique can also be used for the DCS, EGSM, TDMA, and AMPS wireless protocols.

A second AFC technique corrects the clock signal at reference clock PLL 400. In this second embodiment, microcontroller 110 transmits a signal to register 216 via node 160, and register sends an AFC control signal to reference clock PLL 400 via node 496 to adjust the clock signal of PLL 400. This second AFC technique is preferably used for EGSM and DCS wireless protocols because of the need for more accurate clock signals in these three wireless protocols. However, this second AFC technique can also be used for the TDMA, IDEN, and AMPS wireless protocols.

As illustrated in FIG. 2, portion 150 of transceiver 100 further comprises a divider 450 coupled to reference oscillator 403. Register 216 sends a control signal to divider 450 via a node 489 to program divider 450 to divide by one, two, three, or four. Divider 450 provides a reference frequency to a component within transceiver 100. In the preferred embodiment, divider 450 provides the reference frequency to phase detector 201 via node 200. Accordingly, divider 450 provides the reference frequencies for phase detector 201 at a preferred frequency of 26 MHz for the DCS and EGSM wireless protocols and at a preferred frequency of 16.8 MHz reference signal for the IDEN, TDMA, and AMPS wireless protocols. In the DCS and EGSM modes, crystal element 402 is selected and frequency divider 450 is programmed to divide by 1. In IDEN, TDMA, and AMPS modes, crystal element 401 is selected and divider 450 is also programmed to divide by one.

Another AFC technique can be applied to accumulators 206 of the fractional N PLL. In this third AFC technique, microcontroller 110 transmits a signal to register 216 via node 160, and register 216 transmits a control signal to accumulators 206 via a node 486. This third AFC technique is preferably used for the DCS and EGSM wireless protocols, but can also be used for the TDMA, IDEN, and AMPS wireless protocols.

EGSM/DCS RX mode VCO 199 in FIG. 1 provides the first LO signal for mixer 140 while transceiver 100 operates in both the DCS and EGSM receive modes. The received RF signal passes through antenna 190, switched antenna filter network 129, and RX front-end stage 185 to mixer 140. As the RF signal is received, divider 450 provides a reference frequency to phase detector 201 via node 200, and phase detector 201 transmits a phase correction signal to charge pump 232. Charge pump 232 couples the signal to filter 233, which operates as a wide band filter as programmed by register 216 via node 292. Filter 233 couples the signal to VCO 199, and VCO 199 transmits the LO signal to mixer 140. Mixer 140 mixes the signal from VCO 199 with the RF signal from RX front-end stage 185, and mixer 140 outputs an intermediate frequency (IF) signal having a frequency of approximately 400 MHz.

During the DCS receive mode, register 216 sends a control signal to enable VCO 199 via a node 296 and also sends control signals to VCOs 134, 104, and 131 via nodes 297, 298, and 299 to de-select VCOs 134, 104, and 131. VCO 199 operates over a range of approximately 1405 to 1480 MHz in the DCS receive mode. The received RF signal for the DCS wireless protocol has a frequency band of approximately 1,805 to 1,880 MHz. Accordingly, the IF output of mixer 140 is approximately 400 MHz. In this embodiment, mixer 140 performs a low-side first LO injection of the VCO signal to the received RF signal.

During the EGSM receive mode, register 216 sends a control signal to enable VCO 199 via node 296 and also sends control signals to VCOs 134, 104, and 131 via nodes 297, 298, and 299 to de-select VCOs 134, 104, and 131. VCO 199 operates over a range of approximately 1325 to 1360 MHz in the EGSM receive mode. The received RF signal for the EGSM wireless protocol has a frequency band of approximately 925 to 960 MHz. Accordingly, the IF output of mixer 140 is approximately 400 MHz. In this embodiment, mixer 140 performs a high-side first LO injection of the VCO signal to the received RF signal.

During the TDMA and AMPS receive modes, register 216 sends a control signal to VCO 134 via node 297 to enable VCO 134, which preferably oscillates at approximately 981 to 1,006 MHz. Register 216 also sends control signals to VCOs 199, 104, and 131 via nodes 296, 298, and 299 to de-select VCOs 199, 104, and 131. The received RF signal for the TDMA and AMPS wireless protocol has a frequency band of approximately 869 to 894 MHz. Accordingly, the output of mixer 140 is approximately 112 MHz. In this embodiment, mixer 140 performs a high-side first LO injection of the VCO signal to the received RF signal.

During the IDEN wireless protocol, register 216 sends a control signal to VCO 134 via node 297 to enable VCO 134, which preferably oscillates at approximately 963 to 982 MHz. Register 216 also sends control signals to VCOs 199, 104, and 131 via nodes 296, 298, and 299 to de-select VCOs 199, 104, and 131. The received RF signal for the IDEN wireless protocol has a frequency of approximately 851 to 870 MHz. Accordingly, the output of mixer 140 is approximately 112 MHz. In this embodiment, mixer 140 performs a high-side first LO injection of the VCO signal to the received RF signal.

Mixer 140 transmits its output signal to filters 142 and 141, which filter a 112 MHz or a 400 MHz signal, respectively. Filters 142 and 141 output their respective signals to a RX back-end stage 433 via nodes 151 and 152, respectively. RX back-end stage 433 is also coupled to and receives another input signal from a divider 434. Register 216 sends a control signal to divider 434 via a node 488 to program divider 434 to divide by four for the DCS and GSM wireless protocols and to divide by one for the IDEN, TDMA, and AMPS wireless protocols, Divider 434 is coupled to and receives an input signal from LO PLL 435. Register 216 sends a control signal to LO PLL 435 via a node 487 to program a divider ratio in LO PLL 435. LO PLL 435 is a second LO PLL synthesizer that outputs a signal that is approximately twice the IF for the DCS and EGSM receive modes and approximately eight times the IF for the IDEN, TDMA, and AMPS receive modes. For example, LO PLL 435 outputs a signal at a frequency of approximately 800 MHz for the DCS and EGSM wireless protocols and approximately 898 MHz for the IDEN, TDMA, and AMPS wireless protocols. In the preferred embodiment, LO PLL 435 includes a single VCO. Both LO PLL 435 and offset PLL 126 are required when the AMPS wireless protocol is used because of the full duplex mode for the AMPS wireless protocol.

LO PLL 435 is coupled to and receives an input signal from a divider 412 via a node 481. Divider 412 is coupled to and receives an input signal from reference oscillator 403 via comparator 413. Register 216 transmits a control signal to divider 412 via a node 490 to program divider 412 to divide by seven, eight, ten, fourteen, or twenty-six. Divider 412 provides a reference frequency to a third component of transceiver 100. In the preferred embodiment, divider 412 provides the reference frequency to LO PLL 435 via node 481. The reference frequency provided to PLL 435 by divider 412 varies depending upon the particular wireless protocol for the incoming RF signal received by transceiver 100. Divider 412 also provides a reference frequency to TX offset PLL 126 via node 481 in the IDEN, TDMA, and AMPS transmit modes. In the DCS and EGSM transmit modes, register 216 sends control signal to TX offset PLL 126 via a node 293 to disable TX offset PLL 126, and register 216 also sends a control signal to TX up-converter 125 via a node 291 to disable TX up-converter 125.

RX back-end stage 433 performs the second LO conversion to baseband and outputs an in-phase (I) and quadrature (Q) analog signal to an A/D converter and data interface stage 440. An A/D converter portion of stage 440 converts the I and Q signals into a parallel digital signal, and a data interface portion of stage 440 converts the parallel digital signal into a serial digital signal and transmits the serial digital signal to the DSP portion of microcontroller 110 via a node 159. Stage 440 is coupled to and receives an input signal from a divider 411 via a node 480. Divider 411 is coupled to and receives an input signal from a mux 410, and mux 410 is coupled to and receives input signals from reference clock PLL 400 and from crystal reference oscillator 403 via comparator 413. Divider 411 provides a clock signal to a component in transceiver 100. In the preferred embodiment, divider 411 provides the clock signal to A/D converter and data interface stage 440 via node 480 and at the following frequencies: 13 MHz for the DCS and EGSM wireless protocols; 16.8 MHz for the IDEN wireless protocol; and 19.44 MHz for the TDMA and AMPS wireless protocols.

Mux 410 can select the desired clock signal from a first clock path comprising reference clock PLL 400, divider 407, comparator 413, reference oscillator 403, and either crystal element 401 or 402. Alternatively, mux 410 can select the desired clock signal from a second clock path comprising comparator 413, reference oscillator 403 and either crystal element 401 or 402. As explained earlier, the clock signal from reference clock PLL 400 is more accurate or precise than the clock signal from crystal reference oscillator 403, but using the clock signal from reference clock PLL 400 consumes more power than using the clock signal from crystal reference oscillator 403. Microcontroller 110 sends a signal to register 216 via node 160, and register 216 sends a control signal to mux 410 via a node 492 to determine whether to transmit the more precise clock signal or the less precise clock signal to A/D converter and data interface stage 440. As also explained earlier, mux 410 selects the less precise clock signal when operating under the IDEN wireless protocol in order to conserve power. Register 216 also sends a control signal to divider 411 via a node 491 to program divider 411 to divide by one, two, three, or four. In the preferred embodiment, divider 411 outputs a data interface clock signal having a frequency of approximately 13 MHz for the DCS and GSM wireless protocols, approximately 16.8 MHz for the IDEN wireless protocol, approximately 19.44 MHz for the TDMA and AMPS wireless protocols. As described in earlier, the 13 MHz data interface clock is preferred for DCS and EGSM protocols because the bit clock rate is standardized at 270.833 KHz. For TDMA protocol, the symbol rate is standardized at 24,300 symbols per second. Industry standards further require TDMA cellular telephones to be capable of switching between TDMA and AMPS wireless protocols. Therefore, the preferred data interface clock under the AMPS wireless protocol is the same 19.44 MHz frequency as used under the TDMA wireless protocol. This embodiment of portion 150 of transceiver 100 with programmable clock dividers 408 and 422 enables the use of a faster clock signal for microcontroller 110 while maintaining the previously assigned data clock signals of 13 MHz, 16.8 MHz, and 19.44 MHz for A/D converter and data interface stage 440.

Prior to operation in the DCS or EGSM transmit modes, the transceiver 100 is reconfigured as follows: microcontroller 110 sends an instruction signal to program control register 216 via node 160, and serial register 216 sends control signals to VCOs 199, 134, 104, and 131 via nodes 296, 297, 298, and 299 respectively. For the DCS transmit mode, the control signals select or enable VCO 131 and de-select or disable VCOs 199, 104 and 134. For the EGSM transmit mode, the control signals select or enable VCO 104 and de-select or disable VCOs 199, 131 and 134. For the DCS and EGSM transmit modes, wide band charge pump 202 is enabled by control signals from serial register 216 sent to node 294. Charge pump 232 is disabled by control signal from serial register 216 sent to a node 295. In both the DCS and EGSM transmit modes, the fractional N synthesizer is configured in this wide bandwidth mode to improve synthesizer lock time.

For the DCS transmit mode, the signal at the output of VCO 131 is coupled to filtered amplifier stage 128, from filtered amplifier stage 128 to switched antenna filter network 129, and from switched antenna filter network 129 to antenna 190. The direct launch transmission signal from the VCO 131 is preferably transmitted out of antenna 190 over a range of approximately 1,710 to 1,785 MHz on 200 KHz channel spacings.

For the EGSM transmit mode, the signal at the output of VCO 104 is coupled to filtered amplifier stage 128, from filtered amplifier stage 128 to switched antenna filter network 129, and from switched antenna filter network 129 to antenna 190. This direct launch transmission signal from VCO 104 is preferably transmitted out of antenna 190 over a range of approximately 880 to 915 MHz on 200 KHz channel spacings.

For IDEN and TDMA transmit modes, I/Q modulation stage 436 couples analog I and Q signals to TX up-converter stage 125 via nodes 154 and 153, and TX up-converter stage 125 up-converts the analog I and Q signals to a modulated RF carrier signal. In particular, I/Q modulation stage 436 transmits the analog I and Q signals from nodes 153 and 154, respectively, to mixers 171 and 172, respectively, in TX up-converter stage 125. TX offset PLL 126 operates at a fixed output frequency of approximately 315 MHz. The offset PLL signal from TX offset PLL 126 is mixed with the output signal of VCO 134 by mixer 170 in TX up-converter stage 125. Amplifier stage 127 transmits the filtered signal to switched antenna filter network 129 and out of transceiver 100 through antenna 190 over the approximate IDEN transmit frequency band of 806 to 825 MHz and over an approximate TDMA frequency range 824 to 849 MHz.

Prior to operation in the IDEN or TDMA transmit modes, microcontroller 110 sends an instruction signal to register 216 via node 160, and register 216 also sends control signals to VCOs 199, 104 and 131 via nodes 296, 298, and 299, respectively, to de-select VCOs 199, 104, and 131, respectively. VCO 134 and charge pump 232 are enabled in the IDEN transmit mode by control signals sent from register 216 via nodes 297 and 295. Register 216 further sends a control signal to offset PLL 126 via a node 293 to enable offset PLL 126. Register 216 also sends a control signal to node 292 to enable charge pump 232. In the IDEN and TDMA transmit modes, the fractional N synthesizer operates with a narrow loop bandwidth to reduce undesired out of band noise and spurious components.

In the AMPS mode, transceiver 100 simultaneously operates in transmit and receive modes. Simultaneous operation of the transmit and receive modes is commonly referred to as duplex operation. In the AMPS duplex mode, I/Q modulation stage 436 transmits the analog modulating signals from nodes 153 and 154, respectively, to mixers 171 and 172, respectively, in TX up-converter stage 125. VCO 134 preferably oscillates at approximately 981 to 1,006 MHz. Register 216 also sends control signals to VCOs 199, 104 and 131 via nodes 296, 298, and 299, respectively, to de-select VCOs 199, 104, and 131, respectively. VCO 134 and charge pump 232 are enabled in the AMPS duplex mode by control signals sent from register 216 via nodes 297 and 295. Register 216 further sends a control signal to offset PLL 126 via a node 293 to enable offset PLL 126. In the AMPS duplex mode, the fractional N synthesizer operates with a narrow loop bandwidth to reduce undesired out of band noise and spurious components. Offset PLL 126 operates at a fixed output frequency of approximately 315 MHz. This offset PLL signal is mixed with the output signal of VCO 134 by mixer 170 in up-converter stage 125. The output frequency of up-converter stage covers the AMPS transmit range of approximately 824 to 849 MHz.

The receiver circuitry in transceiver 100 operates as follows in the AMPS duplex mode. The output signal from VCO 134 is coupled to mixer 140 to down-convert the incoming AMPS RF signal. As described earlier, LO PLL 435 also operates in the AMPS mode providing a second LO signal of approximately 898 MHz. This second LO signal is coupled to frequency divider 434, which divides the second LO signal by four. The output signal of divider 434 is coupled to RX back-end stage 433 to convert the incoming IF signal from frequency selection filter 142 to I and Q baseband signals. These I and Q signals are then converted from analog to digital by A/D converter and data interface stage 440 and sent to microcontroller 110 for demodulation.

Figure 3:
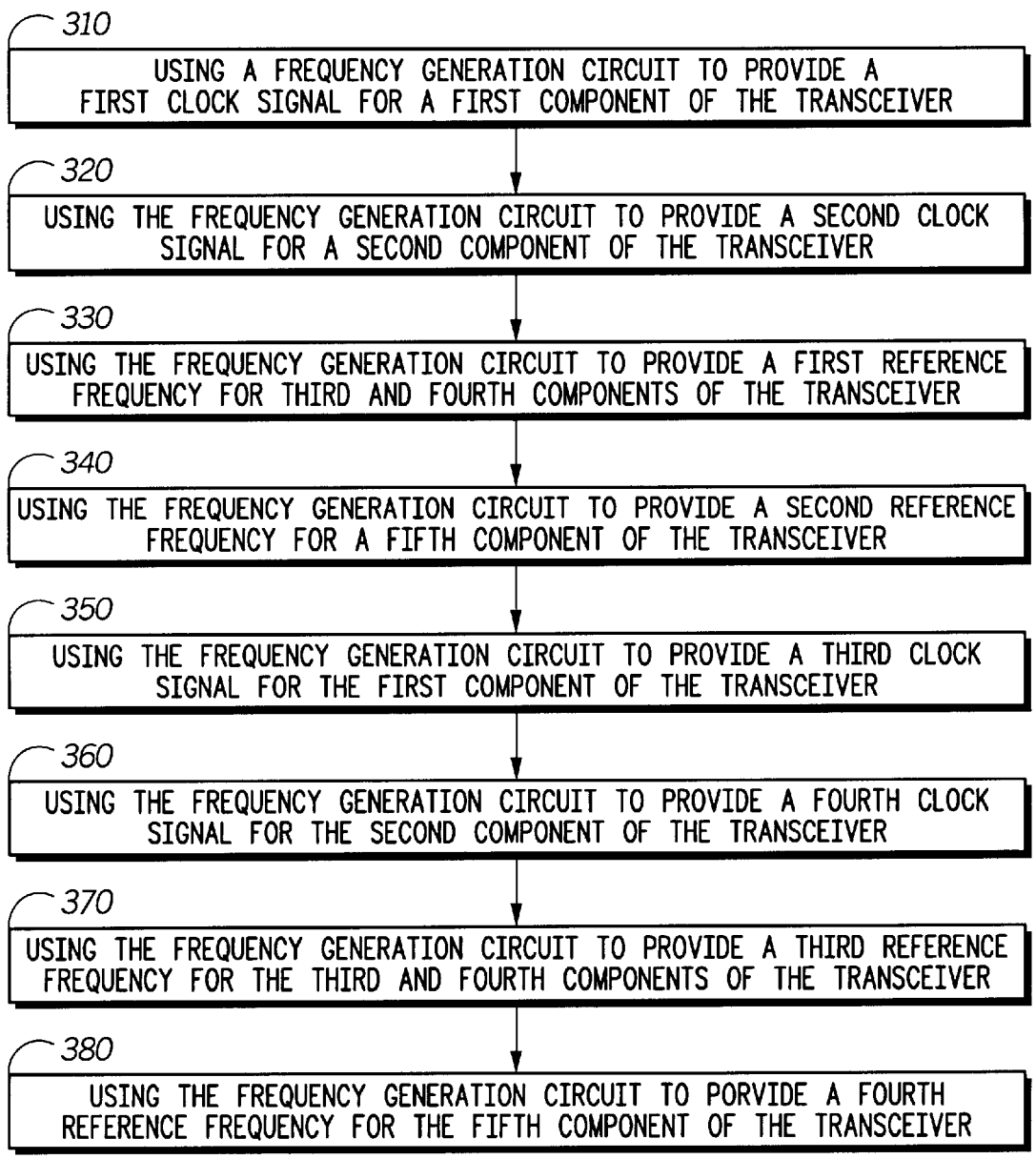
FIG. 3 illustrates a flow chart for a method of operating the transceiver of FIG. 1 in accordance with an embodiment of the invention.

FIG. 3 illustrates a flow chart of a method 500 of operating transceiver 100 (FIG. 1). At a step 510 of method 500, a frequency generation circuit provides a first clock signal for a first component of the transceiver. In the preferred embodiment, the first component is a microcontroller such as microcontroller 110 (FIG. 1). At a step 520, the frequency generation circuit provides a second clock signal for a second component of the transceiver. The second clock signal can be different from the first clock signal. In the preferred embodiment, the second component is an A/D converter and data interface such as A/D converter and data interface stage 440 (FIG. 2). Also in the preferred embodiment, the first and second clock signals are used for a first wireless protocol selected from a group of wireless protocols consisting of EGSM, DCS, TDMA, IDEN, and AMPS wireless protocols.

At a step 530 of method 500, the frequency generation circuit provides a first reference frequency for third and fourth components of the transceiver. The third component is preferably a LO PLL, such as LO PLL 435 (FIG. 2), which is used to process in-coming signals, and the fourth component is preferably an offset PLL, such as TX offset PLL 126, which is used to process out-going signals. Also in the preferred embodiment, the same reference frequency is provided for the third and fourth components. At a step 540, the frequency generation circuit provides a second reference frequency for a fifth component of the transceiver. The second reference frequency can be different from the first reference frequency. The fifth component is preferably a PLL, such as the fractional N synthesizer described earlier, used to provide the modulation for the signal transmitted from the transceiver. The first and second reference frequencies are preferably used for the first wireless protocol of steps 510 and 520.

At a step 550, the frequency generation circuit provides a third clock signal for the first component of the transceiver. At a step 560, the frequency generation circuit provides a fourth clock signal for the second component of the transceiver. In the preferred embodiment, the third and fourth clock signals are for a second wireless protocol different from the first wireless protocol and selected from the same group of wireless protocols described earlier. The third and fourth clock signals can be different from each other and can also be different from the first and second clock signals. At a step 570, the frequency generation circuit provides a third reference frequency for the third and fourth components of the transceiver, and at a step 580, the frequency generation circuit provides a fourth reference frequency for the fifth component of the transceiver. The third and fourth reference frequencies can be different from each other and can also be different from the first and second reference frequencies. In the preferred embodiment, the third and fourth frequencies are used for the second wireless protocol of steps 550 and 560.

Method 500 can also include steps for correcting the first and third clock signals for the first component, for correcting the second and fourth clock signals for the second component, and for correcting a PLL frequency of the fifth component that receives the second and fourth reference frequencies. Furthermore, as explained earlier, step 510 of method 500 generates a first microcontroller clock signal for a particular wireless protocol. Step 510 can also be used to generate a second microcontroller clock signal for the same wireless protocol. In this embodiment, the first microcontroller clock signal is more accurate than the second microcontroller clock signal, but consumes more power than the method for generating the second microcontroller clock signal. Therefore, the second microcontroller clock signal can be generated during a battery-save mode, while the first microcontroller clock signal can be generated during an active mode.

Therefore, a frequency generation circuit and method of operating a transceiver comprising the frequency generation circuit is provided to overcome the disadvantages of the prior art. The frequency generation circuit and method of operating the transceiver comprising the frequency generation circuit efficiently and cost-effectively down-converts a received RF signal on multiple frequency bands, up-converts a signal for wireless transmission on multiple frequency bands, generates internal clock signals for the microcontroller, and generates timing signals for the data interfaces to the digital signal processing circuitry. Furthermore, the frequency generation circuit and method of operating the transceiver comprising the frequency generation circuit is capable of operating under at least a majority of the wireless protocols.

Although the invention has been described with reference to specific embodiments, it will be understood by those skilled in the art that various changes may be made without departing from the spirit or scope of the invention. For instance, the numerous details set forth herein such as, for example, the operating frequencies of VCOs 199, 134, 104, and 131 and crystal elements 401 and 402 are provided to facilitate the understanding of the invention and are not provided to limit the scope of the invention. Furthermore, instead of using a single IC capable of operating under all of the major wireless protocols, different modules capable of operating under different wireless protocols can be separately attached to a cellular phone. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A frequency generation circuit comprising:
   a reference oscillator;
   a comparator coupled to the reference oscillator;
   a first divider coupled to the comparator;
   a first PLL coupled to the first divider;
   a second divider coupled to the first PLL;
   a first multiplexor coupled to the second divider; and
   a third divider coupled to the comparator and to the first multiplexor.

2. The frequency generation circuit of claim 1 further comprising:
   a first crystal element coupled to the reference oscillator; and
   a second crystal element coupled to the reference oscillator.

3. The frequency generation circuit of claim 2 further comprising:
   a varactor stage coupled to the first crystal element; and
   a digital-to-analog converter coupled to the varactor stage.

4. The frequency generation circuit of claim 1 further comprising:
   a second multiplexor coupled to the comparator and to the first PLL;
   a fourth divider coupled to the second multiplexor; and
   a fifth divider coupled to the comparator.

5. The frequency generation circuit of claim 4 further comprising:
   a second PLL coupled to the fifth divider;
   a sixth divider coupled to the second PLL;
   a receive back-end stage coupled to the sixth divider; and
   an analog-to-digital converter and data interface stage coupled to the receive back-end stage and to the fourth divider.

6. The frequency generation circuit of claim 5 further comprising:
   a microcontroller coupled to the first multiplexor and to the analog-to-digital converter and data interface stage;
   a seventh divider coupled to the comparator;
   a synthesizer coupled to the seventh divider;
   a mixer coupled to the synthesizer;
   a receive front-end stage coupled to the mixer;
   an antenna switch coupled to the receive front-end stage;
   a first frequency selection filter coupled to the mixer and to the receive back-end stage; and
   a second frequency selection filter coupled to the mixer and to the receive back-end stage.

7. The frequency generation circuit of claim 4 wherein:
   the first multiplexor provides a first clock signal;
   the fourth divider provides a second clock signal; and
   the fifth divider provides a first reference frequency.

8. The frequency generation circuit of claim 7 further comprising:
   a sixth divider coupled to the reference oscillator;
   wherein:
      the sixth divider provides a second reference frequency;
      the first and second clock signals are used during a wireless protocol selected from the group consisting of an EGSM wireless protocol, a DCS wireless protocol, a TDMA wireless protocol, an IDEN wireless protocol, and an AMPS wireless protocol; and
      the first and second reference frequencies are used during the wireless protocol.

9. The frequency generation circuit of claim 1 further comprising:
   a fourth divider coupled to the reference oscillator.

10. The frequency generation circuit of claim 9 further comprising:
    a synthesizer coupled to the fourth divider and comprising:
       a phase detector;
       a first loop filter coupled to the phase detector;
       a first voltage-controlled oscillator coupled to the first loop filter;
       a divider coupled to the first voltage-controlled oscillator and to the phase detector; and
       accumulators coupled to the divider.

11. The frequency generation circuit of claim 10 wherein: the synthesizer further comprises:
    a second voltage-controlled oscillator coupled to the first loop filter and to the divider.

12. The frequency generation circuit of claim 11 further comprising:
    an antenna switch; and
    a first filter coupled to the antenna switch, to the first voltage-controlled oscillator, and to the second voltage-controlled oscillator.

13. The frequency generation circuit of claim 10 wherein: the synthesizer further comprises:
    a second loop filter coupled to the phase detector; and
    a second voltage-controlled oscillator coupled to the second loop filter and to the divider.

14. The frequency generation circuit of claim 13 wherein: the synthesizer further comprises:
    a third voltage-controlled oscillator coupled to the second loop filter and to the divider.

15. The frequency generation circuit of claim 14 further comprising:
    a mixer coupled to the second and third voltage-controlled oscillators;
    a receive front-end stage coupled to the mixer; and
    an up-converter stage coupled to the second voltage-controlled oscillator.

16. The frequency generation circuit of claim 15 further comprising:
    an antenna switch;
    a first filter coupled to the antenna switch and to the up-converter stage; and
    a second filter coupled to the antenna switch and to the first and second voltage-controlled oscillators.

17. A portable transceiver comprising:
a digital-to-analog converter;
a varactor stage coupled to the digital-to-analog converter;
a reference oscillator coupled to the varactor stage;
a comparator coupled to the reference oscillator;
a first divider coupled to the comparator;
a reference clock PLL coupled to the first divider;
a second divider coupled to the reference clock PLL;
a first multiplexor coupled to the second divider;
a third divider coupled to the comparator and to the first multiplexor;
a second multiplexor coupled to the comparator and to the reference clock PLL;
a fourth divider coupled to the second multiplexor;
a fifth divider coupled to the comparator;
a first PLL coupled to the fifth divider;
a second PLL coupled to the fifth divider;
a sixth divider coupled to the first PLL;
a receive back-end stage coupled to the sixth divider;
an analog-to-digital converter and data interface stage coupled to the receive back-end stage and to the fourth divider;
a seventh divider coupled to the comparator; and
a fractional N synthesizer coupled to the seventh divider.

18. The portable transceiver of claim 17 wherein:
the first multiplexor provides a first clock signal to a microcontroller;
the fourth divider provides a second clock signal to the analog-to-digital converter and ta interface stage;
the fifth divider provides a first reference frequency to the first and second PLLs; and
the seventh divider provides a second reference frequency to the fractional N synthesizer.

19. The portable transceiver of claim 17 wherein:
the first multiplexor and the fourth divider provide different clock signals for different wireless protocols selected from the group consisting of a EGSM wireless protocol, a DCS wireless protocol, a TDMA wireless protocol, an IDEN wireless protocol, and an AMPS wireless protocol; and
the fifth and seventh dividers provide different reference frequencies for different wireless protocols selected from the group consisting of the EGSM wireless protocol, the DCS wireless protocol, the TDMA wireless protocol, the IDEN wireless protocol, and the AMPS wireless protocol.

20. The portable transceiver of claim 17 further comprising:
a first crystal element operating at a first frequency and coupled to the reference oscillator;
a second crystal element operating at a second frequency different from the first frequency and coupled to the reference oscillator;
a microcontroller coupled to the first multiplexor and to the analog-to-digital converter and data interface stage;
a first filter coupled to the fractional N synthesizer;
an antenna switch coupled to the first filter;
an antenna coupled to the antenna switch;
a receive front-end stage coupled to the antenna switch;
a mixer coupled to the fractional N synthesizer;
a first frequency filter coupled to the mixer and to the receive back-end stage;
a second frequency filter coupled to the mixer and to the receive back-end stage;
a transmit up-converter stage coupled to the fractional N synthesizer and to the second PLL;
a second filter coupled to the transmit up-converter stage and to the antenna switch; and
an I/Q modulation stage coupled to the transmit up-converter stage.

21. The portable transceiver of claim 17 wherein:
the fractional N synthesizer comprises:
a phase detector coupled to the seventh divider;
a first charge pump coupled to the phase detector;
a first loop filter coupled to the first charge pump;
a first voltage-controlled oscillator coupled to the first loop filter;
an eighth divider coupled to the first voltage-controlled oscillator and to the phase detector;
accumulators coupled to the eighth divider;
a second voltage-controlled oscillator coupled to the first loop filter and to the eighth divider;
a second charge pump coupled to the phase detector;
a second loop filter coupled to the second charge pump; and
a third voltage-controlled oscillator coupled to the second loop filter and to the eighth divider.

* * * * *